United States Patent
Oda et al.

(10) Patent No.: US 10,483,286 B2
(45) Date of Patent: Nov. 19, 2019

(54) ARRAY SUBSTRATE, LIQUID CRYSTAL DISPLAY, THIN FILM TRANSISTOR, AND MANUFACTURING METHOD OF ARRAY SUBSTRATE

(71) Applicant: Mitsubishi Electric Corporation, Tokyo (JP)

(72) Inventors: Koji Oda, Kumamoto (JP); Kazunori Inoue, Kumamoto (JP); Kensuke Nagayama, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/906,665

(22) Filed: Feb. 27, 2018

(65) Prior Publication Data

US 2018/0261631 A1    Sep. 13, 2018

(30) Foreign Application Priority Data

Mar. 9, 2017  (JP) ................ 2017-044981

(51) Int. Cl.
*H01L 27/12* (2006.01)
*G02F 1/13* (2006.01)
(Continued)

(52) U.S. Cl.
CPC ........ *H01L 27/1225* (2013.01); *G02F 1/1368* (2013.01); *G02F 1/13439* (2013.01); *G02F 1/134363* (2013.01); *G02F 1/136259* (2013.01); *H01L 27/124* (2013.01); *H01L 27/1251* (2013.01); *H01L 27/1262* (2013.01); *H01L 27/1285* (2013.01); *H01L 29/41733* (2013.01);
(Continued)

(58) Field of Classification Search
CPC .......... H01L 27/1225; H01L 29/41733; H01L 27/1285; H01L 27/1251; H01L 27/124; H01L 29/78669; H01L 27/1262; H01L 29/498; H01L 27/3274; G02F 1/1368; G02F 1/134363; G02F 1/13439; G02F 1/13454; G02F 2202/103
See application file for complete search history.

(56) References Cited

U.S. PATENT DOCUMENTS 6,016,174 A    1/2000  Endo et al.
2005/0039670 A1    2/2005  Hosono et al.
(Continued)

FOREIGN PATENT DOCUMENTS

JP    H05-063196 A    3/1993
JP    H10-268353 A    10/1998
(Continued)

*Primary Examiner* — Thanhha S Pham
(74) *Attorney, Agent, or Firm* — Studebaker & Brackett PC

(57) ABSTRACT

An array substrate according to the present invention is a TFT substrate including a pixel TFT and a drive TFT on a substrate, where the pixel TFT includes a first source electrode, a first drain electrode, and an amorphous silicon layer, and the drive TFT includes a third oxide semiconductor layer provided on a gate insulating film while overlapping a second gate electrode in plan view, and a second source electrode and a second drain electrode overlapping the third oxide semiconductor layer in plan view, with a third separation portion separating the second source electrode and the second drain electrode from each other.

11 Claims, 11 Drawing Sheets

(51) Int. Cl.
*H01L 29/786* (2006.01)
*H01L 29/417* (2006.01)
*G02F 1/1368* (2006.01)
*G02F 1/1343* (2006.01)
*G02F 1/1362* (2006.01)
*H01L 29/66* (2006.01)
*H01L 29/49* (2006.01)
*H01L 21/383* (2006.01)
*G02F 1/1345* (2006.01)

(52) U.S. Cl.
CPC .... *H01L 29/78669* (2013.01); *G02F 1/13454* (2013.01); *G02F 2001/134318* (2013.01); *G02F 2001/134381* (2013.01); *G02F 2001/136268* (2013.01); *G02F 2202/10* (2013.01); *G02F 2202/103* (2013.01); *H01L 21/383* (2013.01); *H01L 29/4908* (2013.01); *H01L 29/66765* (2013.01); *H01L 29/66969* (2013.01); *H01L 29/7869* (2013.01); *H01L 29/78618* (2013.01)

(56) References Cited

U.S. PATENT DOCUMENTS

| | | |
|---|---|---|
| 2010/0252826 A1 | 10/2010 | Yamazaki et al. |
| 2011/0012112 A1 | 1/2011 | Yamazaki et al. |
| 2011/0084272 A1* | 4/2011 | Miyanaga ........... H01L 27/1225 257/43 |
| 2012/0300151 A1 | 11/2012 | Yamazaki et al. |
| 2013/0126878 A1 | 5/2013 | Yamazaki et al. |
| 2014/0293183 A1 | 10/2014 | Yamazaki et al. |
| 2015/0053976 A1 | 2/2015 | Yamazaki et al. |
| 2016/0118417 A1 | 4/2016 | Yamazaki et al. |

FOREIGN PATENT DOCUMENTS

| | | |
|---|---|---|
| JP | 2004-103957 A | 4/2004 |
| JP | 2005-077822 A | 3/2005 |
| JP | 2010-003910 A | 1/2010 |
| JP | 2011-029579 A | 2/2011 |
| JP | 2011-044699 A | 3/2011 |

\* cited by examiner

F I G . 2
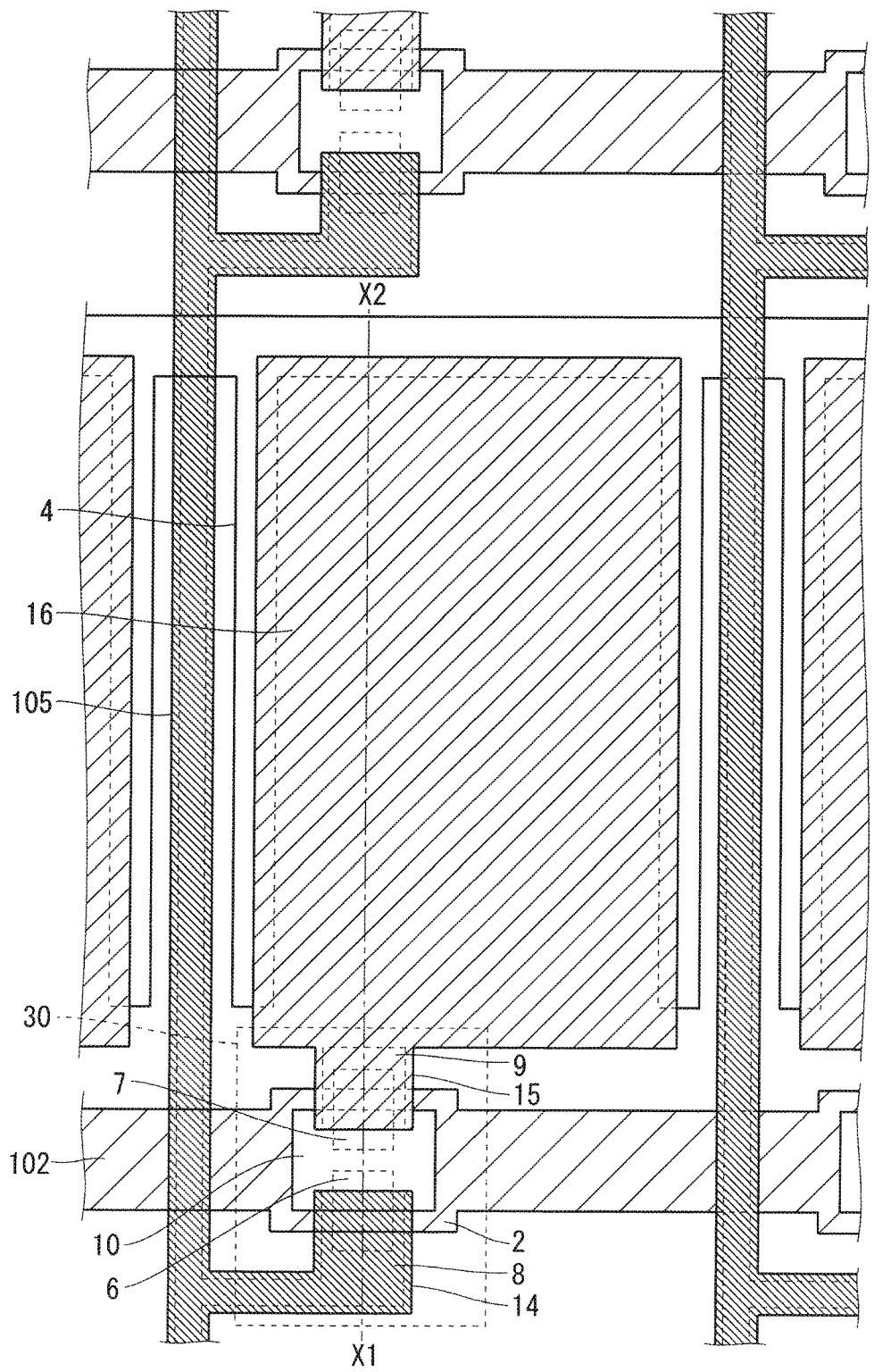

F I G . 3
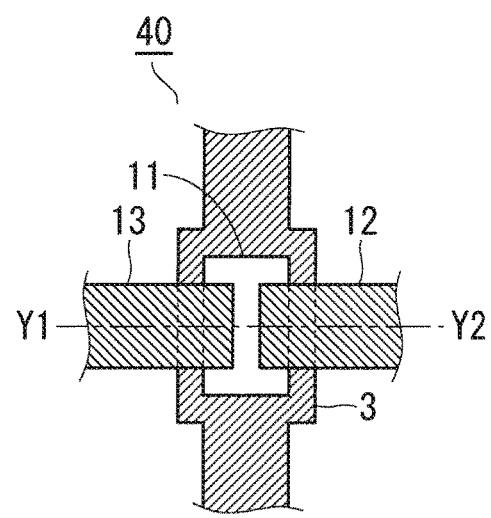

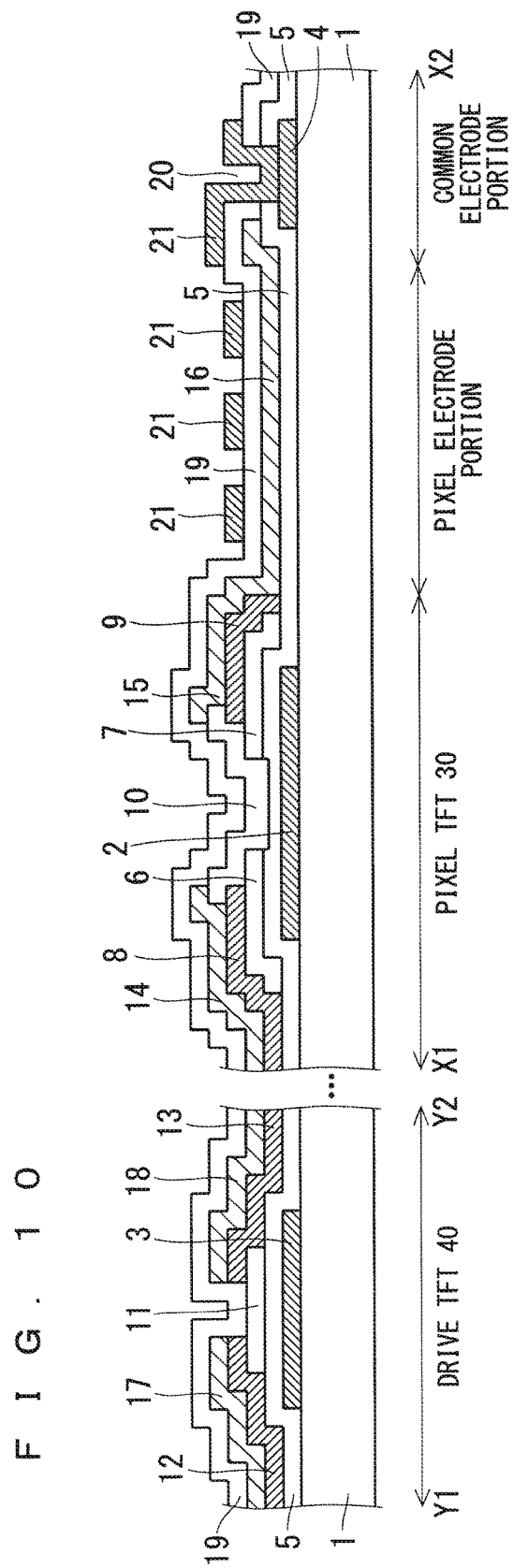

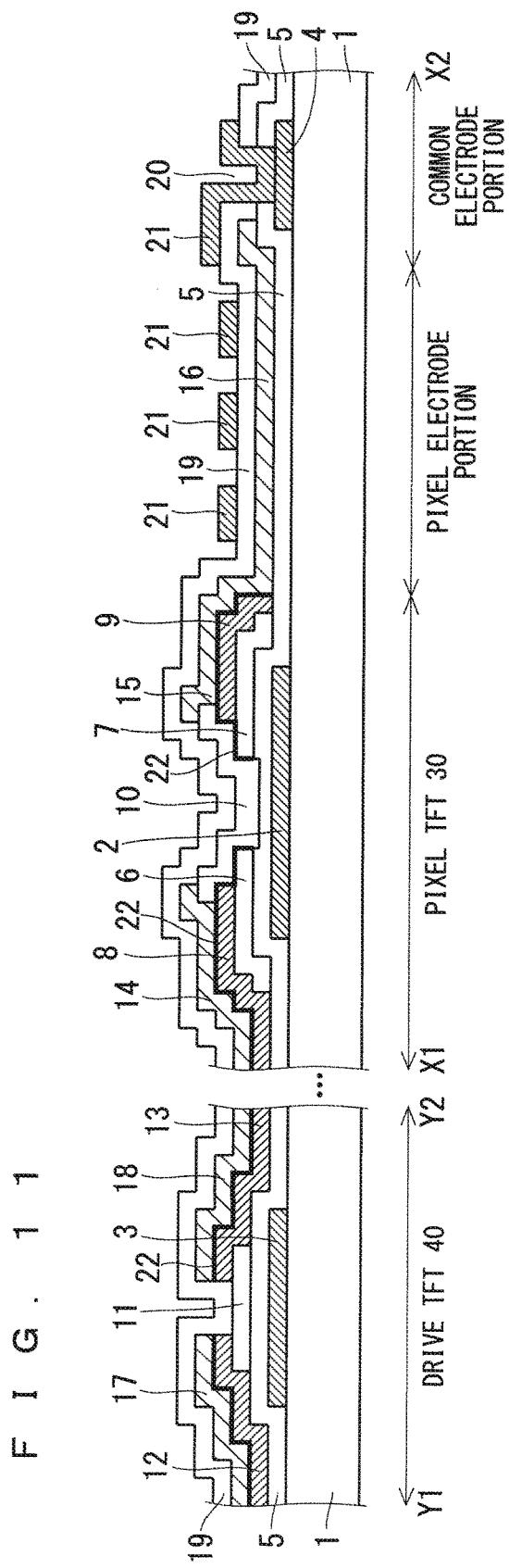

ARRAY SUBSTRATE, LIQUID CRYSTAL DISPLAY, THIN FILM TRANSISTOR, AND MANUFACTURING METHOD OF ARRAY SUBSTRATE

BACKGROUND OF THE INVENTION

Field of the Invention

The present invention relates to an array substrate, a liquid crystal display, a thin film transistor, and a manufacturing method of the array substrate.

Description of the Background Art

A liquid crystal display (LCD), which is one of conventional general thin panels, is widely used as a monitor of a personal computer, a portable information terminal appliance or the like, by taking advantages of low power consumption and of being small and light. In recent years, it is also widely used in TVs.

Particularly, an active matrix substrate which uses a thin film transistor (TFT) as a switching element of a pixel is well known to be used in an electro-optic device such as a liquid crystal display. In the following, the active matrix which uses a TFT as a switching element of a pixel will be referred to as a TFT substrate. With respect to a liquid crystal display which uses a TFT substrate, there is a demand for an increase in the display performance, such as widened viewing angle, increased resolution, and increased quality, and also, for reduction in the cost by efficient manufacturing with simplified manufacturing steps.

Generally, a liquid crystal display which uses a TFT substrate uses, as a basic structure, a liquid crystal panel interposing a liquid crystal layer between a TFT substrate where pixels, each including a pixel electrode and a TFT connected to the pixel electrode, are arranged in matrices, and a counter substrate including a counter electrode arranged opposite the pixel electrode, and a color filter (CF), for example, and the liquid crystal display includes a polarizer or the like attached to the liquid crystal panel. For example, a fully transmissive liquid crystal display includes a back light (BL) provided on a rear side of the liquid crystal panel. In the following, a TFT connected to a pixel electrode will be referred to as a pixel TFT. A TFT substrate will alternatively be referred to as an element substrate, and a counter substrate will alternatively be referred to as a CF substrate.

A liquid crystal panel as described above where a pixel electrode and a counter electrode are arranged to sandwich a liquid crystal layer to generate an electric field for driving a liquid crystal may adopt a vertical electric-field driving method or a horizontal electric-field driving method. A vertical electric-field driving method may be a twisted nematic (TN) method or a vertical alignment (VA) method, for example. A horizontal electric-field driving method may be an in plane switching method according to which a pixel electrode and a counter electrode are disposed on a TFT substrate side, or a fringe field switching (FFS) method, for example.

Conventionally, a pixel TFT for a liquid crystal display generally uses amorphous silicon (a-Si) for a channel layer of a semiconductor. The main reason is that, when amorphous is used, a film with highly uniform properties may be formed even in the case of a large area substrate, and also, a processing temperature for deposition of an amorphous silicon film is about 300° C. or lower, and the film may be deposited at a relatively low temperature, and thus, the film may be deposited even on an inexpensive, low heat resistant glass substrate; accordingly, amorphous silicon is suitably used in a liquid crystal display to be used in a TV, for example, which has a large display area and the cost of which is desired to be reduced.

A pixel TFT which uses amorphous silicon for a channel layer normally uses a TFT structure called an inverted staggered structure. When a TFT having an inverted staggered structure is used, there is an advantage that a TFT substrate of the TN method or the VA method may be efficiently manufactured at a low cost, by five photomechanical steps (for example, see Japanese Patent Application Laid-Open. No. 10-268353 (1998)). A TFT having an inverted staggered structure is based on a back channel etching (BCE) TFT structure requiring a BCE step, and a BCE TFT that uses amorphous silicon may be suitably used as a pixel TFT.

However, a TFT which uses amorphous silicon has a low mobility of around 0.5 $cm^2V/sec$, and thus, a TFT for configuring a drive circuit for driving a pixel TFT is difficult to form. In the following, a TFT configuring a drive circuit will be referred to as a drive TFT. A drive circuit provided in a general liquid crystal display has a drive integrated circuit (IC) chip, where a TFT and a capacitive element are integrated, attached to a liquid crystal panel from outside. Accordingly, a space for attaching an external IC has to be provided in a peripheral region of the liquid crystal panel, and limits are imposed on reduction in the size and cost of the liquid crystal display.

On the other hand, a TFT which uses micro crystalline or poly crystalline silicon (Si) for a channel layer, instead of amorphous, can achieve a high mobility exceeding 10 $cm^2$/Vsec. For example, there is disclosed a technique of forming a pixel TFT and a drive TFT on the same substrate by using poly crystalline silicon for a channel layer (for example, see Japanese Patent Application Laid-Open No. 5-63196 (1993)). A liquid crystal display having such a configuration does not require an external IC, and can form the drive TFT by a photomechanical step in the same manner as the pixel TFT, and thus, the size and the manufacturing cost of the liquid crystal display can be reduced.

Moreover, in recent years, a TFT which uses an oxide semiconductor for a channel layer is being developed (for example, see Japanese Patent Application Laid-Open No. 2004-103957 and Japanese Patent Application Laid-Open No. 2005-77822). For example, the oxide semiconductor may be zinc oxide (ZnO) based, or InGaZnO based, which adds gallium oxide ($Ga_2O_3$) and indium oxide ($In_2O_3$) to zinc oxide (ZnO).

An oxide semiconductor has an advantage that, because a film in an amorphous state with high uniformity may be stably obtained by making composition appropriate, and a mobility higher by an order of magnitude or more than conventional amorphous silicon, or more specifically, a mobility of 5 $cm^2V/sec$ or more, may be realized, a small high-performance TFT may be realized. Accordingly, by using the oxide semiconductor for a channel layer, a pixel TFT and a drive TFT may be formed on the same substrate (for example, see Japanese Patent Application Laid-Open No. 2011-29579 and Japanese Patent Application Laid-Open No. 2011-44699).

As described above, if a pixel TFT and a drive TFT can be formed on the same substrate, the size and the cost of a liquid crystal display can be reduced. However, a TFT which uses amorphous silicon, which is suitable for a pixel TFT, for a channel layer has a low mobility, and is not easily used as a drive TFT, which requires a high mobility.

In the case of manufacturing a BCE TFT of an inverted staggered structure which uses amorphous silicon for a channel layer, as in the case of Japanese Patent Application Laid-Open No. 10-268353 (1998), a good ohmic contact property cannot be obtained at an interface between the amorphous silicon channel layer and a metal layer, and thus, an n-type amorphous silicon layer, resistance of which is reduced by adding group 13 atoms, such as phosphorus (P), to the amorphous silicon and by increasing electron carriers, has to be provided at an interface of the channel layer to a source electrode and a drain electrode. The n-type amorphous silicon layer functions as an ohmic contact layer. Accordingly, a step of removing the n-type amorphous silicon layer formed on the amorphous silicon channel layer has to be performed after forming the source electrode and the drain electrode. However, because the channel layer and the n-type amorphous silicon layer are of the same amorphous silicon-based material, it is difficult to accurately and selectively remove only the n-type amorphous silicon layer by etching while leaving only the channel layer, and in the case of a large area substrate, poor uniformity in the etching process may result in poor uniformity in the TFT properties, and defects such as display unevenness may be caused.

In the case of forming a pixel TFT and a drive TFT on the same substrate by using a micro crystalline or poly crystalline silicon with a high mobility for a channel layer, as in the case of Japanese Patent Application Laid-Open No. 5-63196 (1993), a high-temperature process at a temperature close to 1000° C. is required to crystallize the silicon. Accordingly, a device such as a high-temperature annealing furnace is necessary. Furthermore, an expensive highly heat-resistant substrate of quartz or the like is necessary, and thus, there are problems that the material cost is increased, and also, because the size of a quartz substrate is difficult to increase, a large-sized liquid crystal display cannot be manufactured.

As a method of polycrystallizing silicon at a relatively low temperature, there is a laser annealing method of radiating excimer laser or the like on the silicon. A silicon polycrystallization technique which uses laser radiation is generally widely known as a low temperature poly silicon (LTPS) technique, and a process temperature may generally be at or below 500° C. However, according to this method, uniform crystallization of a silicon channel layer over a wide area is difficult, and precise control has to be performed at the time of scanning a wide range by laser. Furthermore, a laser radiation device becomes necessary, and the manufacturing cost is increased. Moreover, in the case of manufacturing a BCE TFT by using crystallized silicon, there is a problem regarding uniformity of etching in the BCE step, as in the case of amorphous silicon.

In the case of forming a pixel TFT and a drive TFT on the same substrate by using an oxide semiconductor for a channel layer, as in the case of Japanese Patent Application Laid-Open No. 2011-29579 and Japanese Patent Application Laid-Open No. 2011-44699, there are advantages that a film in an amorphous state with high uniformity may be stably obtained by making composition of the oxide semiconductor appropriate, and that the mobility is higher than that of conventional amorphous silicon. Moreover, an amorphous oxide can be manufactured by a process at a relatively low temperature, and thus, a TFT can be manufactured by the same equipment as the equipment used for manufacturing the conventional amorphous silicon, and an increase in the manufacturing cost may be prevented.

However, the TFT properties of a TFT which uses an oxide semiconductor for a channel layer are known to be degraded with respect to light. Degradation of the TFT properties for light is referred to as photo-degradation. Photo-degradation of a drive TFT configuring a drive circuit formed at a peripheral region of a liquid crystal panel may be prevented by blocking light at the peripheral region, for example. On the other hand, with respect to a pixel TFT in a display region, photo-degradation may be caused by incidence, on a channel layer, of back light radiated from the rear side or leaked light, i.e.

stray light, caused by external light entering from the front side, thereby possibly causing display defects.

SUMMARY

The present invention has its object to provide an array substrate which allows a pixel TFT and a drive TFT having good properties to be formed on the same substrate, a small liquid crystal display which is capable of achieving a high display quality, a thin film transistor which is a pixel TFT having good properties, and a manufacturing method of an array substrate which allows manufacture at a low cost. An array substrate according to the present invention is an array substrate including a first thin film transistor and a second thin film transistor on a substrate, where the first thin film transistor includes a first gate electrode provided on the substrate, a gate insulating film provided covering the first gate electrode, a first oxide semiconductor layer and a second oxide semiconductor layer provided on the gate insulating film while overlapping the first gate electrode in plan view, with a first separation portion separating the first oxide semiconductor layer and the second oxide semiconductor layer from each other, a first source electrode and a first drain electrode provided extending from above the first oxide semiconductor layer and above the second oxide semiconductor layer, respectively, onto the gate insulating film while overlapping the first oxide semiconductor layer or the second oxide semiconductor layer in plan view, with a second separation portion, greater than the first separation portion, separating the first source electrode and the first drain electrode from each other, and an amorphous silicon layer provided extending on the first separation portion on the gate insulating film, the second separation portion, a part of the first source electrode, and a part of the first drain electrode, and the second thin film transistor includes a second gate electrode provided on the substrate, the gate insulating film provided covering the second gate electrode, a third oxide semiconductor layer provided on the gate insulating film while overlapping the second gate electrode in plan view, and a second source electrode and a second drain electrode provided extending from above the third oxide semiconductor layer onto the gate insulating film while overlapping the third oxide semiconductor layer in plan view, with a third separation portion separating the second source electrode and the second drain electrode from each other.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view illustrating an example configuration around a pixel TFT according to the preferred embodiment of the present invention;

FIG. 3 is a plan view illustrating an example configuration of a drive TFT according to the preferred embodiment of the present invention;

FIG. 10 is a cross-sectional view illustrating example configurations of a pixel TFT and a drive TFT according to a modification 1; and FIG. 11 is a cross-sectional view illustrating example configurations of a pixel TFT and a drive TFT according to a modification 2.

DESCRIPTION OF THE PREFERRED EMBODIMENTS

A preferred embodiment of the present invention will be described below with reference to the drawings. Additionally, a TFT according to the present preferred embodiment is used as a switching element, and may be applied to a pixel and a drive circuit of a TFT substrate of a liquid crystal display or the like.

Preferred Embodiment

<Configuration of TFT Substrate>

Figure 1:
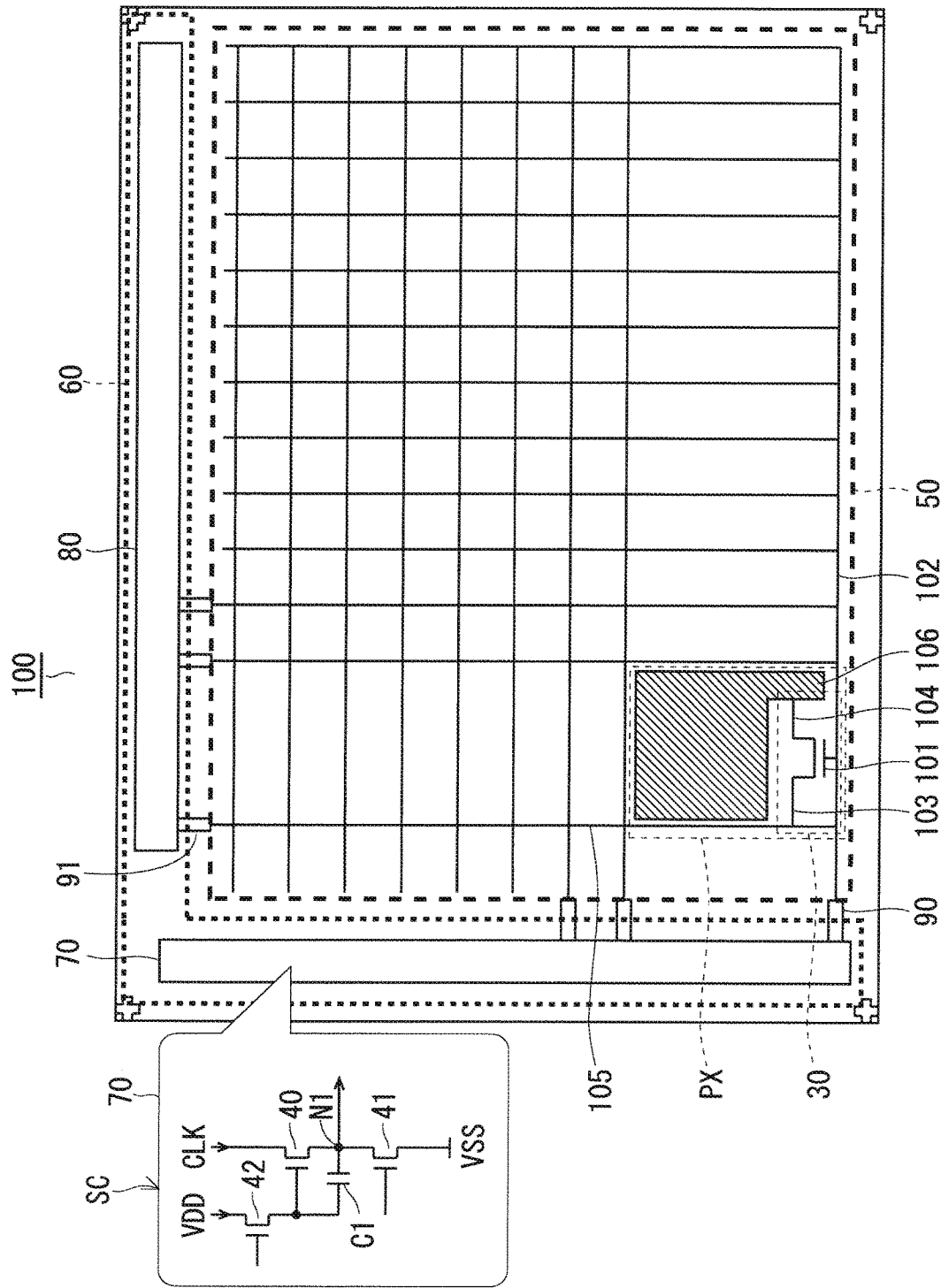
FIG. 1 is a plan view illustrating an example configuration of a TFT substrate according to a preferred embodiment of the present invention.

FIG. 1 is a plan view illustrating an example configuration of a TFT substrate 100, which is an array substrate according to a preferred embodiment of the present invention, and is a view for schematically describing an overall configuration of the TFT substrate 100.

The TFT substrate 100 is roughly divided into a display region 50 where pixel regions PX, each including a pixel TFT 30, which is a first thin film transistor, are arranged in a matrix, and a frame region 60 provided in the periphery of the display region 50.

In the display region 50, a plurality of gate lines 102 and a plurality of source lines 105 are arranged orthogonally intersecting each other, and a pixel region PX including the pixel TFT 30 and a pixel electrode 106 are provided in a manner corresponding to each orthogonal intersection portion.

In the frame region 60, a scanning signal drive circuit 70 for applying a drive voltage to the gate line 102, and a display signal drive circuit 80 for applying a drive voltage to the source line 105 are arranged. When a current is caused to selectively flow through one gate line 102 by the scanning signal drive circuit 70, and a current is caused to selectively flow through one source line 105 by the display signal drive circuit 80, the pixel TFT 30 existing at the orthogonal intersection portion where these gate line 102 and source line 105 orthogonally intersect each other is placed in an on state, and charge is accumulated in the pixel electrode 106 connected to this pixel TFT 30.

For example, as illustrated in a balloon in FIG. 1, the scanning signal drive circuit 70 includes a plurality of drive voltage generation circuits SC each including drive TFTs, 40, 41, 42, which are second thin film transistors, and the like. The display signal drive circuit 80 likewise includes a plurality of drive voltage generation circuits, not illustrated. A current which flows through the drive TFT 40, 41, 42 flows from a drain electrode to a source electrode.

For example, the drive voltage generation circuit SC includes the drive TFT 40 where a clock signal CLK is applied to a drain, the drive TFT 41 where a ground potential VSS is applied to a source and a drain is connected to a source of the drive TFT 40, and the drive TFT 42 where a power potential VDD is applied to a drain and a source is connected to a gate of the drive TFT 40. Additionally, the source of the drive TFT 42 is connected to a connection node N1 between the drive TFT 40 and the drive TFT 41 via a capacitor C1. The connection node N1 serves as an output node of the drive voltage generation circuit SC, and applies a drive voltage to the corresponding gate line 102.

When the drive TFT 42 is placed in an on state by a signal applied to a gate of the drive TFT 42, the drive TFT 40 is placed in an on state, and the clock signal CLK is output from the connection node N1. Furthermore, when the drive TFT 41 is placed in an on state by a signal applied to a gate of the drive TFT 41, a potential at the connection node N1 is fixed at the ground potential VSS.

As described below, in the present preferred embodiment, proven conventional amorphous silicon is used for a channel layer of the pixel TFT 30. Accordingly, a liquid crystal display with stable display properties and reduced photo-degradation may be manufactured. Furthermore, an oxide semiconductor is used for channel layers of the TFTs 40, 41, 42. The oxide semiconductor has a high mobility, and thus, by using the drive TFTs 40, 41, 42, each using the oxide semiconductor for the channel layer, the scanning signal drive circuit 70 and the display signal drive circuit 80 that perform stable operation may be obtained, and also, the scanning signal drive circuit 70 and the display signal drive circuit 80 may be reduced in size. As a result, the scanning signal drive circuit 70 and the display signal drive circuit 80 may be provided in a small area in the frame region 60 of the TFT substrate 100. Accordingly, the cost of the scanning signal drive circuit 70 and the display signal drive circuit 80 may be reduced, and a narrow-frame liquid crystal display with a small frame region 60 may be manufactured.

<Configuration of TFT>

In the following, configurations of the pixel TFT 30 and the drive TFT 40 provided in the TFT substrate 100 will be described in detail. Additionally, the drive TFTs 41, 42 have basically the same configuration as the drive TFT 40, and a description thereof will be omitted. In the following, a description will be given assuming that the pixel TFT 30 is used in a light-transmitting liquid crystal display of the vertical electric-field driving method typified by the TN method.

Figure 4:
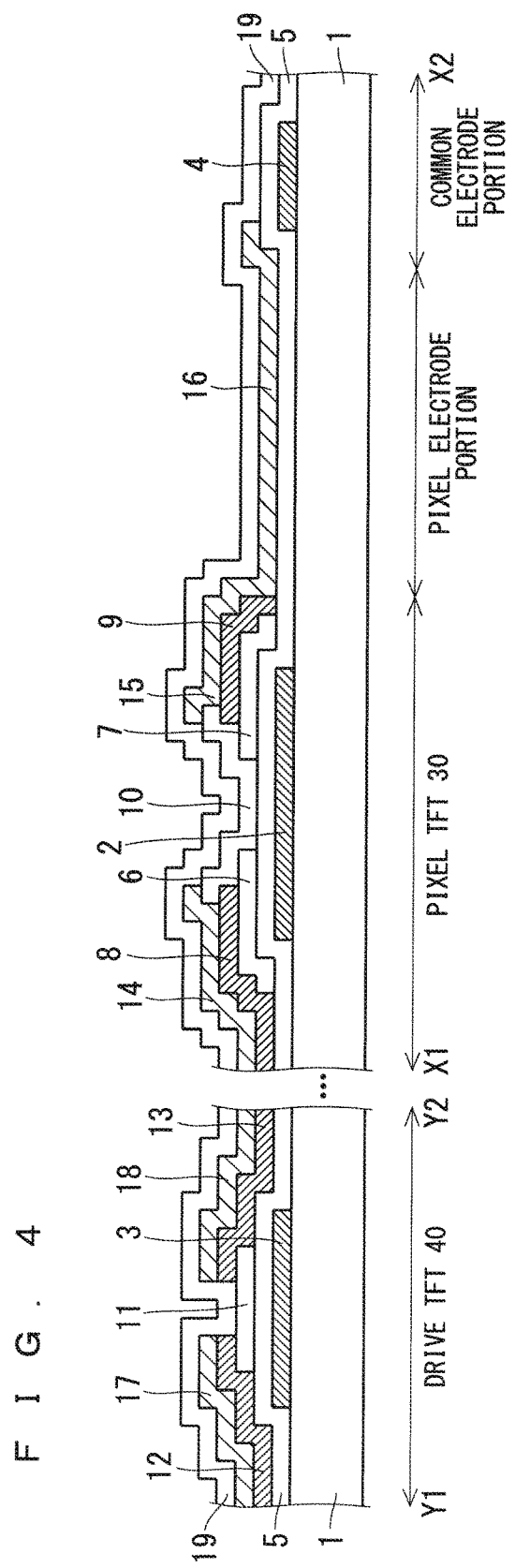
FIG. 4 is a cross-sectional view taken along X1-X2 in FIG. 2, and along Y1-Y2 in FIG. 3.

FIG. 2 is a plan view illustrating an example configuration around the pixel TFT 30, and is a view illustrating a part of the display region 50 including the pixel TFT 30. FIG. 3 is a plan view illustrating an example configuration of the drive TFT 40. FIG. 4 is a cross-sectional view taken along X1-X2 in FIG. 2, and along Y1-Y2 in FIG. 3.

The pixel TFT 30 and the drive TFT 40 are provided on a substrate 1, which is a transparent insulating substrate of glass, for example. More specifically, a first gate electrode 2, a second gate electrode 3, and a common electrode 4, which are light-shielding conductive films of metal or the like, are selectively provided on the substrate 1. The common electrode 4 is alternatively referred to as a common line. The first gate electrode 2 is provided in a region where the pixel TFT 30 is to be provided, and functions as a gate electrode of the pixel TFT 30. The second gate electrode 3 is provided in a region where the drive TFT 40 is to be provided, and functions as a gate electrode of the drive TFT 40.

A gate insulating film 5 formed from a first insulating film is provided on the entire surface of the substrate 1 to cover the first gate electrode 2, the second gate electrode 3, and the common electrode 4. A first oxide semiconductor layer 6 and a second oxide semiconductor layer 7 separated from each other are provided on the gate insulating film 5, in a region overlapping the first gate electrode 2 in plan view. That is, the first oxide semiconductor layer 6 and the second oxide semiconductor layer 7 are provided on the gate insulating film 5 while overlapping the first gate electrode 2 in plan view, with a first separation portion separating the first oxide semiconductor layer 6 and the second oxide semiconductor layer 7 from each other.

A third oxide semiconductor layer 11, which functions as a channel layer, is provided on the gate insulating film 5, in a region overlapping the second gate electrode 3 in plan view. That is, the third oxide semiconductor layer 11 is provided on the gate insulating film 5 while overlapping the second gate electrode 3 in plan view.

A first source electrode 8 is provided on the first oxide semiconductor layer 6 to cover the first oxide semiconductor layer 6, except for a part of the first oxide semiconductor layer 6. A first drain electrode 9 is provided on the second oxide semiconductor layer 7 to cover the second oxide semiconductor layer 7, except for a part of the second oxide semiconductor layer 7. That is, the first source electrode 8 and the first drain electrode 9 are provided extending from the first oxide semiconductor layer 6 and the second oxide semiconductor layer 7, respectively, onto the gate insulating film 5, while overlapping the first oxide semiconductor layer 6 and the second oxide semiconductor layer 7, respectively, in plan view, with a second separation portion, greater than the first separation portion, separating the first source electrode 8 and the first drain electrode 9 from each other. The first oxide semiconductor layer 6 and the first source electrode 8 are connected with good electrical properties. The second oxide semiconductor layer 7 and the first drain electrode 9 are connected with good electrical properties.

As described below, the first oxide semiconductor layer 6 functions as an ohmic contact layer for connecting an amorphous silicon layer 10, which functions as a channel layer, and the first source electrode 8 with good electrical properties. The second oxide semiconductor layer 7 functions as an ohmic contact layer for connecting the amorphous silicon layer 10 and the first drain electrode 9 with good electrical properties.

A second source electrode 12 and a second drain electrode 13 are selectively provided on the third oxide semiconductor layer 11 while being separated from each other. That is, the second source electrode 12 and the second drain electrode 13 are provided extending from above the third oxide semiconductor layer 11 onto the gate insulating film 5 while overlapping the third oxide semiconductor layer 11 in plan view, with a third separation portion separating the second source electrode 12 and the second drain electrode 13 from each other. The third oxide semiconductor layer 11 is connected to each of the second source electrode 12 and the second drain electrode 13 with good electrical properties.

The amorphous silicon layer 10 is provided extending from a part of the gate insulating film 5 where the first oxide semiconductor layer 6 and the second oxide semiconductor layer 7 are separated from each other, onto the first oxide semiconductor layer 6, the second oxide semiconductor layer 7, a part of the first source electrode 8, and a part of the first drain electrode 9. That is, the amorphous silicon layer 10 is provided extending on the first separation portion on the gate insulating film 5, the second separation portion, a part of the first source electrode 8, and a part of the first drain electrode 9.

A third source electrode 14 is provided covering a part of the amorphous silicon layer 10 and the first source electrode 8. A third drain electrode 15 is provided covering a part of the amorphous silicon layer 10 and the first drain electrode 9. That is, the third source electrode 14 and the third drain electrode 15 are provided extending from above the amorphous silicon layer 10 onto the first source electrode 8 and the first drain electrode 9, respectively, while being separated from each other on the amorphous silicon layer 10. The third source electrode 14 and the third drain electrode 15 are provided separated from each other at a part of a region overlapping the first gate electrode 2 in plan view.

The third drain electrode 15 extends from above the first drain electrode 9 onto the gate insulating film 5 and to a pixel electrode portion. The third drain electrode 15 provided at the pixel electrode portion, that is, the third drain electrode 15 provided on the gate insulating film 5, corresponds to a pixel electrode 16. A part of the pixel electrode 16 overlaps the common electrode 4 across the gate insulating film 5 in plan view, and forms a storage capacitor at the overlapping portion.

A fourth source electrode 17 is provided on the second source electrode 12. A fourth drain electrode 18 is provided on the second drain electrode 13. A protective insulating film 19 formed from a second insulating film is provided covering the gate insulating film 5, the amorphous silicon layer 10, the third oxide semiconductor layer 11, the second source electrode 12, the second drain electrode 13, the third source electrode 14, the third drain electrode 15, the fourth source electrode 17, and the fourth drain electrode 18.

The TFT according to the present preferred embodiment is configured in the above manner, and the pixel TFT 30 including the amorphous silicon layer 10 as the channel layer, and the drive TFT 40 including the third oxide semiconductor layer 11 as the channel layer are provided on the TFT substrate 100. Furthermore, at the pixel TFT 30, the first oxide semiconductor layer 6 and the second oxide semiconductor layer 7 are provided as ohmic contact layers for connecting the amorphous silicon layer 10 with the first source electrode 8 and the first drain electrode 9 with good electrical properties.

<Configuration of Liquid Crystal Display>

An alignment film and a spacer are provided on the surface of the TFT substrate illustrated in FIGS. 2, 3. The alignment film is a film for aligning liquid crystal, and is formed of polyimide or the like. Furthermore, a counter substrate which is separately prepared and which includes a color filter, an alignment film and the like, not illustrated, is disposed facing the TFT substrate 100. A gap is formed between the TFT substrate 100 and the counter substrate by the spacer, and liquid crystal is sealed in the gap. A liquid crystal display panel of the TN method or the VA method, which are vertical electric-field driving methods, is thus configured. A liquid crystal display is configured by disposing a polarizing plate, a retardation plate, a backlight unit, and the like outside the liquid crystal display panel.

<Manufacturing Method>

A manufacturing method of the pixel TFT 30 and the drive TFT 40 configuring the TFT substrate 100 according to the present preferred embodiment will be described. FIGS. 5 to 8 are views each illustrating an example of a manufacturing step of the pixel TFT 30 and the drive TFT 40. Additionally, X1-X2 in FIGS. 5 to 8 corresponds to X1-X2 in FIGS. 2, and Y1-Y2 in FIGS. 5 to 8 corresponds to Y1-Y2 in FIG. 3. Moreover, a view illustrating a final step of the manufacturing steps corresponds to FIG. 4.

First, a transparent insulating substrate 1 of glass or the like is washed with washing liquid or pure water. In the present preferred embodiment, a glass substrate having a thickness of 0.6 mm is used as the substrate 1. A first conductive film is formed on the washed substrate 1.

As the first conductive film, metal such as chromium (Cr), molybdenum (Mo), titanium (Ti), copper (Cu), tantalum (Ta), tungsten (W), or aluminum (Al), or an alloy which takes such metallic element as the main component and which adds thereto at least one other type of element may be used, for example. A main component element is an element with the highest content among elements forming the alloy. Additionally, the first conductive film may have a stacked structure including two or more layers of metals mentioned above or two or more alloy layers. By using the above-mentioned metal or alloy, a low-resistance conductive film having a resistivity value of 50 $\mu\Omega$cm or less may be obtained. In the present preferred embodiment, a Cu film, as the first conductive having a thickness of 200 nm is formed by sputtering using argon (Ar) gas.

Figure 5:
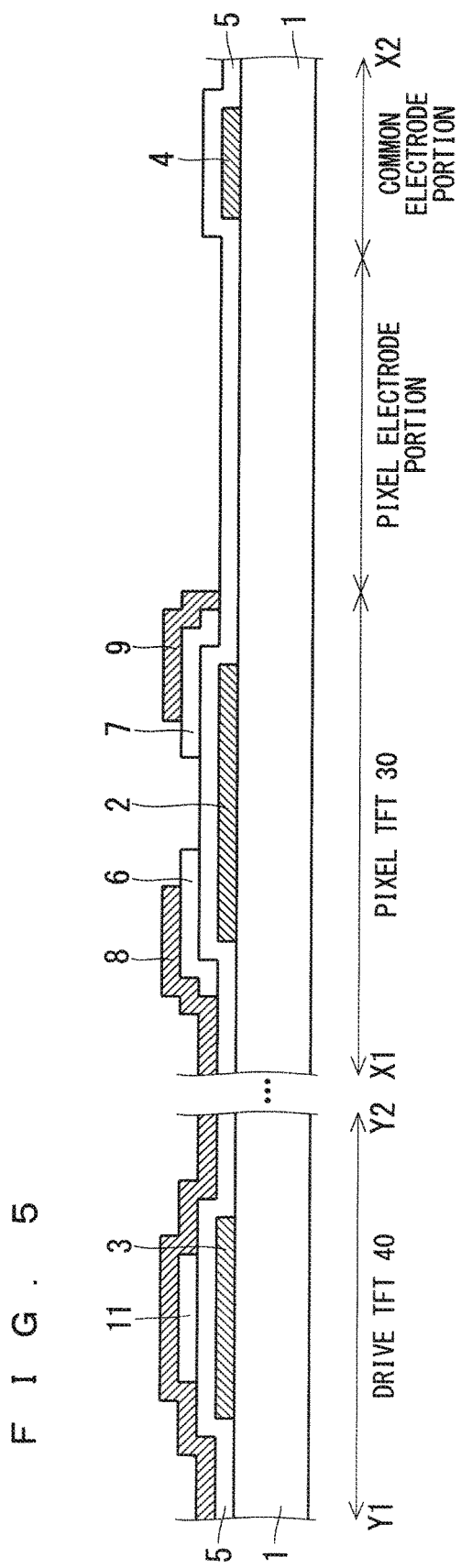
FIGS. 5 to 9 are views each illustrating an example of a manufacturing step of the pixel TFT and the drive TFT according to the preferred embodiment of the present invention.

Next, a photoresist material is applied on the first conductive film, a photoresist pattern s formed in a first photomechanical step, and patterning of the first conductive film is performed by etching, with the photoresist pattern as the mask. In the present preferred embodiment, wet etching is performed by using a solution containing an aqueous solution containing ammonium peroxodisulfate in a concentration of 0.3% by weight. Then, the photoresist pattern is removed, and the first gate electrode 2, the second gate electrode 3, and the common electrode 4 are formed on the substrate 1, as illustrated in FIG. 5. That is, the first gate electrode 2, the second gate electrode 3, and the common electrode 4 are formed of the same layer.

Next, the gate insulating film 5 formed from the first insulating film is formed to cover the first gate electrode 2 and the second gate electrode 3. In the present preferred embodiment, the gate insulating film 5 is formed by depositing a silicon nitride (SiN) film using a chemical vapor deposition (CVD) method. More specifically, the gate insulating film 5 is a silicon nitride film having a thickness of 400 nm. Additionally, the first insulating film is generally referred to as a gate insulating film, because it functions as a gate insulating film in a TFT. In the present preferred embodiment, the gate insulating film 5 is a silicon nitride film, but the gate insulating film 5 may be a silicon oxide film, or a layer stack of a silicon nitride film and a silicon oxide film.

Next, an oxide semiconductor film is formed on the gate insulating film 5. In the present preferred embodiment, an In—Zn—Sn—O target [In$_2$O$_3$.(ZnO)$_6$.(SnO$_2$)$_2$] having an atomic composition ratio In:Zn:Sn:O=2:6:2:13 is used as the oxide semiconductor material. More specifically, an InZnSnO film having a thickness of 50 nm is formed by sputtering using the InZnSnO target. The InZnSnO film is an n-type semiconductor having electron carriers.

Next, a photoresist pattern is formed in a second photomechanical step, and patterning of the oxide semiconductor film of InZnSnO is performed by etching, with the photoresist pattern as the mask. The InZnSnO film immediately after deposition has a non-crystalline structure, and is soluble in a chemical solution containing oxalic acid. On the other hand, reduction in the InZnSnO film is hardly recognized even after the InZnSnO film is dipped for five minutes in a PAN-based chemical solution or an aqueous ammonium persulfate solution in a liquid temperature range of 20° C. to 40° C., and it is impossible to etch the InZnSnO film using the PAN-based chemical solution or the aqueous ammonium persulfate solution. In the present preferred embodiment, wet etching is performed by using a solution containing an aqueous solution containing oxalic acid (dicarboxylic acid) in a concentration of 5% by weight.

Then, the photoresist pattern is removed, and the first oxide semiconductor layer 6 and the second oxide semiconductor layer 7 formed of oxide semiconductor are formed overlapping the first gate electrode 2 in plan view while being separated from each other, and the third oxide semiconductor layer 11 is formed overlapping the second gate electrode 3 in plan view, as illustrated in FIG. 5. That is, the first oxide semiconductor layer 6, the second oxide semiconductor layer 7, and the third oxide semiconductor layer 11 are formed of the same layer.

After the photoresist pattern is removed, the entire substrate is annealed in an air atmosphere at 350° C. and for 60 minutes such that carrier concentration of the first oxide semiconductor layer 6, the second oxide semiconductor layer 7, and the third oxide semiconductor layer 11 becomes 1E+12/cm$^3$ or less.

Next, a second conductive film is formed to cover the gate insulating film 5, the first oxide semiconductor layer 6, the second oxide semiconductor layer 7, and the third oxide semiconductor layer 11. In the present preferred embodiment, a Cu film, as the second conductive film, having a thickness of 200 nm is formed by sputtering using Ar gas.

Next, a photoresist pattern is formed in a third photomechanical step, and patterning of the second conductive film is performed by etching, with the photoresist pattern as the mask. In present preferred embodiment, wet etching is performed by using an ammonium persulfate-based solution in the same manner as when the first conductive film is formed. Then, the photoresist pattern is removed, and the first source electrode 8 and the first drain electrode 9 as illustrated in FIG. 5 are thereby formed. The first source electrode 8 is formed to cover the first oxide semiconductor layer 6, except for a part of the first oxide semiconductor layer 6. The first drain electrode 9 is formed to cover a part of the second oxide semiconductor layer 7. Moreover, at this stage, the third oxide semiconductor layer 11 is completely covered by the second conductive film.

Next, an amorphous silicon film having a thickness of 100 nm is deposited by using the CVD method to cover the gate insulating film 5, the first oxide semiconductor layer 6, the second oxide semiconductor layer 7, the first source electrode 8, the first drain electrode 9, and the second conductive film. In the present preferred embodiment, silane (SiH$_4$) and hydrogen (H$_2$) are used as material gases for amorphous silicon.

Figure 6:
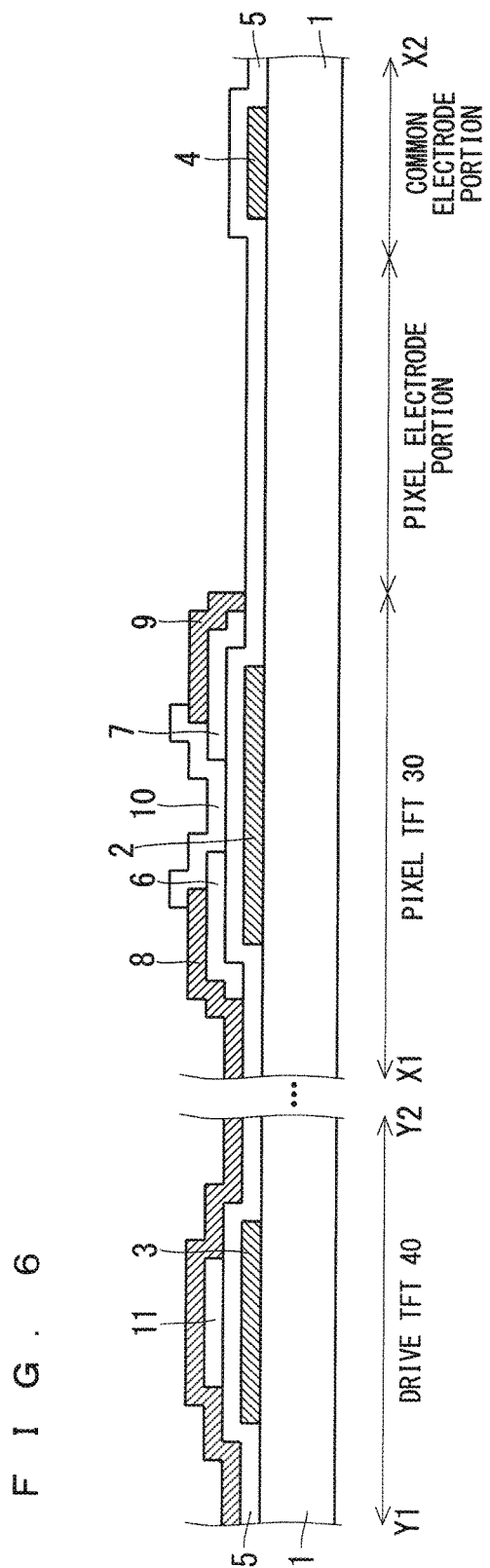

Next, a photoresist pattern is formed in a fourth photomechanical step, and patterning of the amorphous silicon film is performed by etching, with the photoresist pattern as the mask. In the present preferred embodiment, dry etching is performed by using a gas containing sulfur hexafluoride (SF$_6$) gas containing fluorine and hydrogen chloride (HCl) gas. Then, the photoresist pattern is removed, and the amorphous silicon layer 10 as illustrated in FIG. 6 is thereby formed on the gate insulating film 5, the first oxide semiconductor layer 6, the second oxide semiconductor layer 7, a part of the first source electrode 8, and a part of the first drain electrode 9.

Normally, when depositing amorphous silicon, a large amount of hydrogen is generated in a CVD reaction chamber in the deposition process. At this time, regions of the first oxide semiconductor layer 6 and the second oxide semiconductor layer 7 not covered by the second conductive film are exposed to hydrogen radical decomposed by plasma and are reduced. As a result, the carrier concentration is increased to or above $1E19/cm^3$. On the other hand, the third oxide semiconductor layer 11 is completely covered by the second conductive film, and thus, it is not exposed to hydrogen radical and is not reduced, and maintains a carrier concentration of 1E12 to $1E15/cm^3$ or less to thereby function as a channel layer of a TFT.

Generally, a Schottky barrier is present between an amorphous silicon layer and a metal film due to a difference between electron affinity of amorphous silicon and a work function of metal, and thus, ohmic contact is difficult. In the present preferred embodiment, the amorphous silicon layer 10 and the first source electrode 8 are electrically connected via a high concentration region of the first oxide semiconductor layer 6. Furthermore, the amorphous silicon layer 10 and the first drain electrode 9 are electrically connected via a high concentration region of the second oxide semiconductor layer 7. Ohmic contact between the amorphous silicon layer 10 and the first oxide semiconductor layer 6 and the second oxide semiconductor layer 7 is assumed to be due to a small difference between the electron affinity of amorphous silicon and a work function corresponding to ionization potential of the first oxide semiconductor layer 6 and the second oxide semiconductor layer 7 with high carrier concentration.

Figure 7:
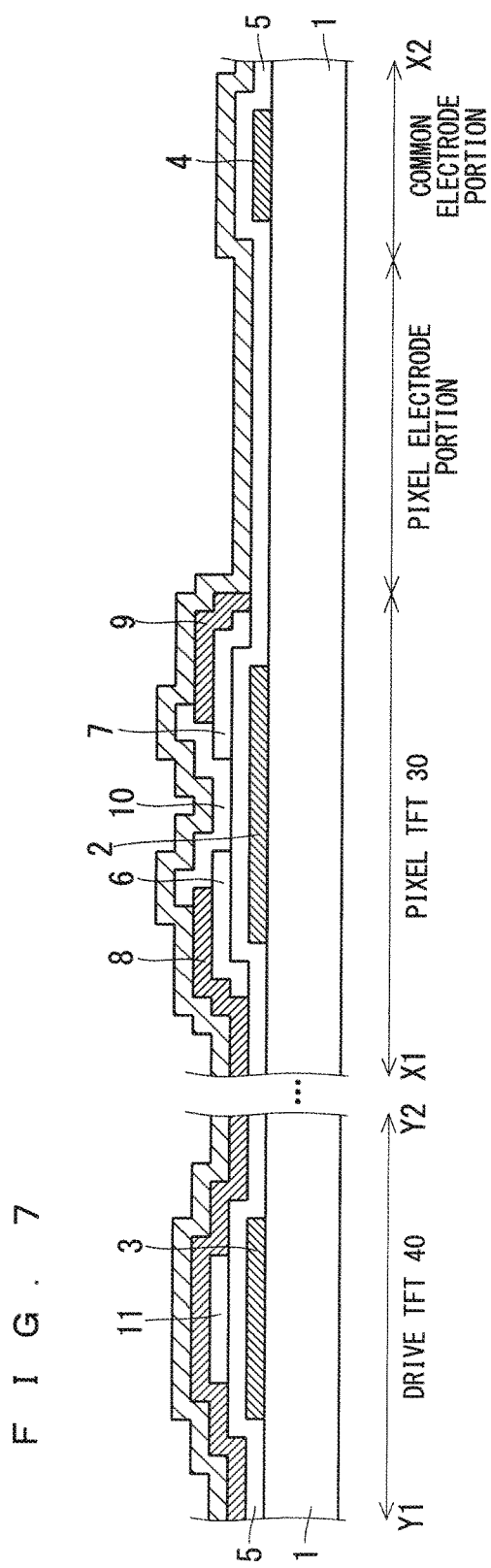

Next, as illustrated in FIG. 7, a third conductive film is formed to cover the gate insulating film 5, the first source electrode 8, the first drain electrode 9, the amorphous silicon layer 10, and the second conductive film. In the present preferred embodiment, an ITO film, which is a light-transmitting oxide-based conductive film, is used as the third conductive film. The ITO film is a mixed oxide film of indium oxide ($In_2O_3$) and tin dioxide ($SnO_2$), and the mixing ratio is $In_2O_3:SnO_2=90:10$ (weight %), for example. Generally, the crystalline structure, or more specifically, the polycrystalline structure, of the ITO film is stable at normal temperature, but in the present preferred embodiment, deposition is performed by sputtering using a gas mixing a gas containing hydrogen (H), such as hydrogen ($H_2$) gas or water vapor ($H_2O$), in argon (Ar), and the ITO film having a thickness of 100 nm is deposited in a non-crystalline state.

Figure 8:
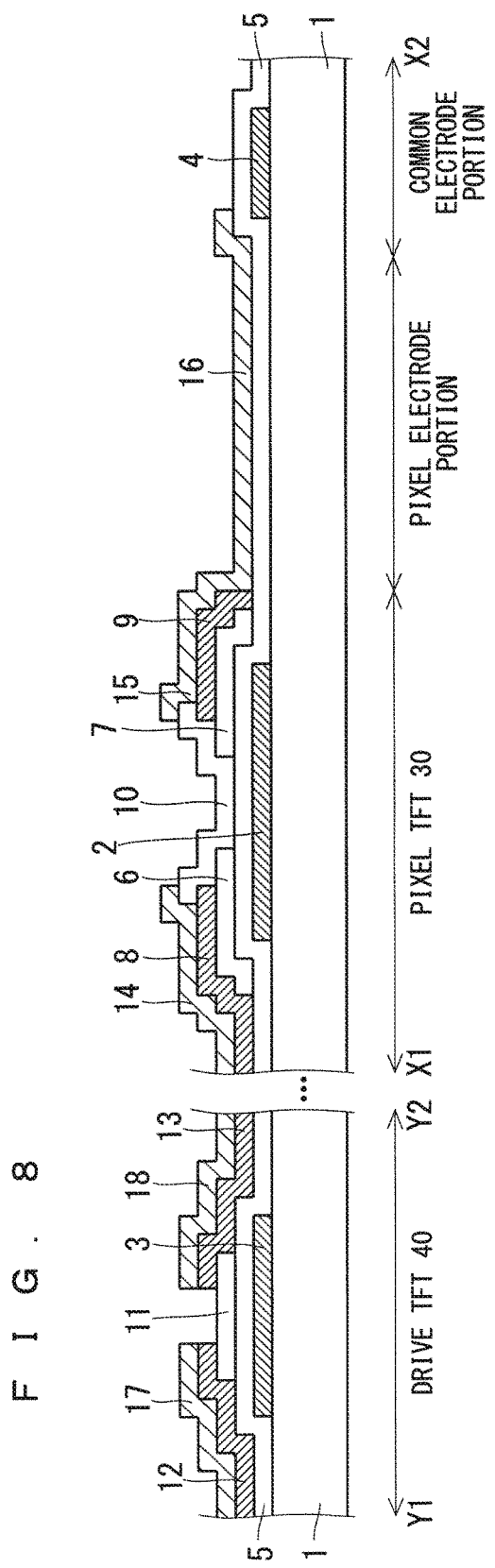

Then, a photoresist pattern is formed in a fifth photomechanical step, and patterning of the non-crystalline ITO film, which is the third conductive film, is performed by etching, with the photoresist pattern as the mask. In the present preferred embodiment, wet etching is performed by using a solution containing oxalic acid. Furthermore, patterning of the second conductive film formed in the region of the drive TFT 40 is performed by wet etching using an ammonium persulfate-based solution. Then, the photoresist pattern is removed, and the second source electrode 12, the second drain electrode 13, the third source electrode 14, the third drain electrode 15, the fourth source electrode 17, the fourth drain electrode 18, and the pixel electrode 16 as illustrated in FIG. 8 are formed. The second source electrode 12 and the fourth source electrode 17 overlap each other in plan view. The second drain electrode 13 and the fourth drain electrode 18 overlap each other in plan view. The second source electrode 12 and the second drain electrode 13 are separated from each other on the third oxide semiconductor layer 11, and the separation portion is made a channel region. That is, the first source electrode 8, the first drain electrode 9, the second source electrode 12, and the second drain electrode 13 are formed of the same layer. The third source electrode 14, the third drain electrode 15, the fourth source electrode 17, and the fourth drain electrode 18 are formed of the same layer.

Next, a second insulating film is formed to cover the gate insulating film 5, the amorphous silicon layer 10, the third oxide semiconductor layer 11, the second source electrode 12, the second drain electrode 13, the third source electrode 14, the third drain electrode 15, the fourth source electrode 17, and the fourth drain electrode 18. In the present preferred embodiment, the protective insulating film 19 is formed by the CVD method, by depositing a silicon oxide (SiO) film having a thickness of 100 nm and a silicon nitride (SiN) film having a thickness of 200 nm in this order.

Then, a photoresist pattern is formed in a sixth photomechanical step, and patterning of the silicon oxide film and the silicon nitride film is performed by etching, with the photoresist pattern as the mask. In the present preferred embodiment, dry etching is performed by using a gas mixing oxygen ($O_2$) in sulfur hexafluoride ($SF_6$) gas.

Next, a contact hole, not illustrated, is formed on the gate electrode and the source electrode by removing the photoresist pattern. Then, thermal treatment is performed in an air atmosphere at 230° C. and for 60 minutes so as to solve issues such as plasma damage which occurred at the TFT substrate in the manufacturing process.

As described above, the pixel TFT 30 including a channel layer that uses amorphous silicon and the drive TFT 40 including a channel layer that uses oxide semiconductor can be fabricated on the substrate 1 by six photomechanical steps. Moreover, by forming a pixel TFT by the pixel TFT 30 including a channel layer that uses amorphous silicon with reduced photo-degradation, and a drive TFT by the drive TFT 40 including the channel layer that uses oxide semiconductor with a high mobility, the TFT substrate 100 incorporating a drive circuit to be used in a light-transmitting liquid crystal display of the TN method may be fabricated.

<Effects>

The TFT substrate 100 according to the present preferred embodiment incorporates the scanning signal drive circuit 70 and the display signal drive circuit 80 in the frame region 60 around the display region 50, and also, the pixel TFT 30 for pixel display is formed by a TFT which uses amorphous silicon with reduced photo-degradation for the channel layer, and the drive TFT 40 is formed by a TFT which uses oxide semiconductor with a high mobility for the channel layer, and thus, a highly reliable narrow-frame liquid crystal display with a high display quality may be manufactured at a low cost.

Furthermore, with the TFT substrate 100 according to the present preferred embodiment, the pixel TFT 30 and the drive TFT 40 are formed from the gate electrodes, the gate insulating film, the source electrodes, and the drain electrodes of the same materials, and thus, the manufacturing steps may be simplified, and the cost may be reduced.

Moreover, the pixel TFT 30 includes the first oxide semiconductor layer 6 and the second oxide semiconductor layer 7 as the ohmic contact layers between the amorphous silicon layer 10, which is the channel layer, and the first source electrode 8 and the first drain electrode 9. Accordingly, compared with an ohmic contact layer which uses a conventional n-type low-resistance silicon semiconductor, more desirable selective etching of the amorphous silicon layer 10, the first oxide semiconductor layer 6, and the second oxide semiconductor layer 7 is enabled. Therefore, even in the case of a large substrate 1, etching uniformity of the ohmic contact layer may be increased. Accordingly, a liquid crystal display with no display unevenness and with a high display quality may be manufactured.

Additionally, a description is given above citing, as an example, a case where a TFT which uses amorphous silicon for the channel layer and which uses the first oxide semiconductor layer 6 and the second oxide semiconductor layer 7 as the ohmic contact layers is used as the pixel TFT 30 for pixel display. However, a TFT which uses amorphous silicon for the channel layer may also be used, due to the property of the TFT in an off state, as a connection TFT for connecting with high resistance the gate line and the source line in the display region and a short ring provided in a peripheral portion of the display region. The short ring here is universally used as a measure against static electricity, and is a line electrically connected to each of the gate lines and the source lines in the display region at the peripheral portion of the display region. Moreover, the connection TFT configures a bidirectional diode by a pair of TFTs, and connects the short ring and the gate line or the source line with high resistance, and is also referred to as a short ring connection TFT. The configuration of the pixel TFT 30 according to the present preferred embodiment may be applied to the connection TFT. By providing, on one TFT substrate, the drive TFT 40, which uses oxide semiconductor for the channel layer, the pixel TFT 30, which uses amorphous silicon for the channel layer, and the connection TFT having the same configuration as the pixel TFT 30, a highly reliable narrow-frame liquid crystal display with a high display quality and excellent resistance to static electricity may be manufactured at a low cost.

Figure 9:
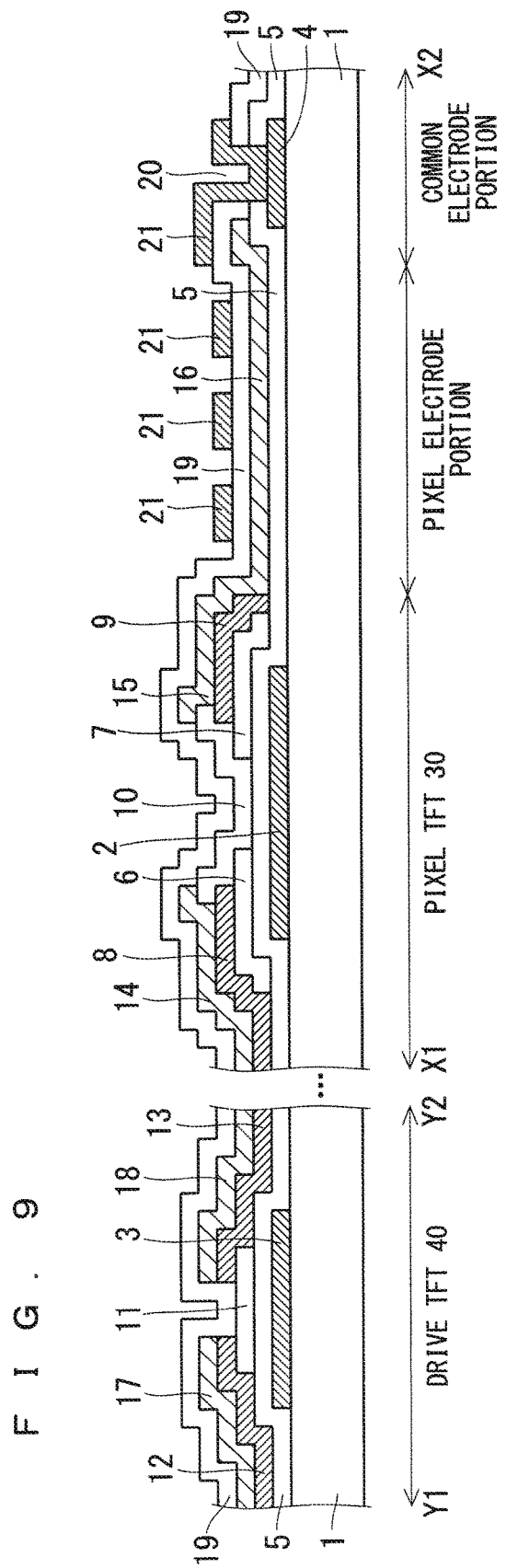

Furthermore, as illustrated in FIG. 9, if a slit-shaped counter electrode 21 is provided on the protective insulating film 19 while overlapping the pixel electrode 16 in plan view, a TFT substrate which is an array substrate which configures a liquid crystal display of the FFS method may be easily manufactured. In the following, a manufacturing method of this TFT substrate will be described.

First, after forming the protective insulating film 19 in the manner illustrated in FIG. 4, a photoresist pattern is formed in a seventh photomechanical step, and patterning of the silicon oxide film and the silicon nitride film forming the protective insulating film 19 is performed by etching, with the photoresist pattern as the mask. Next, a contact hole, not illustrated, is formed on the gate electrode and the source electrode by removing the photoresist pattern, and also, a contact hole 20 is formed so that the top of the common electrode 4 is partly exposed.

Next, a fourth conductive film is formed on the protective insulating film 19 including the contact hole 20. In the present preferred embodiment, an ITO film, which is a light-transmitting oxide-based conductive film, is used as the fourth conductive film. The mixing ratio of indium oxide ($In_2O_3$) and tin dioxide ($SnO_2$) in the ITO film is $In_2O_3$:$SnO_2$=90:10 (weight %), for example. Furthermore, in the present preferred embodiment, deposition is performed by sputtering using a gas mixing a gas containing hydrogen (H), such as hydrogen ($H_2$) gas or water vapor ($H_2O$), in argon (Ar), and the ITO film having a thickness of 100 nm is deposited in a non-crystalline state.

Next, a photoresist pattern is formed in an eighth photomechanical step, and patterning of the non-crystalline ITO film, which is the fourth conductive film, is performed by etching, with the photoresist pattern as the mask. In the present preferred embodiment, wet etching is performed by using a solution containing oxalic acid. Then, the slit-shaped counter electrode 21 as illustrated in FIG. 9 is formed at the pixel electrode portion by removing the photoresist pattern.

The counter electrode 21 is directly connected to the common electrode 4 through the contact hole 20.

The configuration described above allows the TFT substrate which configures a liquid crystal display of the FFS method for driving a liquid crystal by generating a fringe electric field between the pixel electrode 16 and the counter electrode 21 to be fabricated. Furthermore, by disposing a counter substrate on the TFT substrate across the liquid crystal, a liquid crystal display panel of the FFS method may be fabricated. Moreover, a liquid crystal display of the FFS method may be fabricated by disposing a polarizing plate, a retardation plate, a backlight unit, and the like on the liquid crystal display panel.

Additionally, with the liquid crystal display of the FFS method, it is enough if at least one of the pixel electrode and the counter electrode is slit-shaped. Moreover, the liquid crystal display may be easily changed from the FFS method to an IPS method, which is a horizontal electric-field driving method, by making both the pixel electrode and the counter electrode slit electrodes.

<Modifications>

Hereinafter, modifications 1, 2 of the present preferred embodiment will be described.

<Modification 1>

<Configuration>

Generally, when a defect of an amorphous silicon film is terminated with hydrogen, the reliability and the properties of the film are said to be stabilized. Moreover, an oxide semiconductor film is easily reduced by hydrogen, as described above, and when the film is reduced, the carrier concentration is increased, and occurrence of defects in the on/off operation of the TFT is made likely, and Vth shift of the T is increased.

In the preferred embodiment described above, a TFT including an amorphous silicon channel layer and a TFT including an oxide semiconductor channel layer are simultaneously formed on the substrate I, and thus, the gate insulating film 5 is desirably optimized with respect to each channel layer so as to improve the device properties.

The modification 1 is characteristic in that the gate insulating film 5 in contact with the amorphous silicon layer 10 is a silicon nitride film, and the gate insulating film 5 in contact with the third oxide semiconductor layer 11 is a silicon oxide film. A large amount of hydrogen is contained in the silicon nitride film, and a small amount of hydrogen is contained in the silicon oxide film. Accordingly, by making the gate insulating film 5 in contact with the amorphous silicon layer 10 a silicon nitride film containing hydrogen, an interface defect of the amorphous silicon layer 10 is terminated with hydrogen, and the TFT properties are improved. Moreover, by making the gate insulating film 5 in contact with the third oxide semiconductor layer 11 a silicon oxide film containing a small amount of hydrogen, reduction of oxide semiconductor at the third oxide semiconductor layer 11 is suppressed, and a highly reliable TFT with small Vth shift may be obtained.

<Manufacturing Method>

A manufacturing method of the pixel TFT 30 and the drive TFT 40 configuring the TFT substrate 100 according to the modification 1 will be described below. In the following, differences to the preferred embodiment will be mainly described. FIG. 10 is a view illustrating a final mode of the modification 1.

First, the first gate electrode 2, the second gate electrode 3, and the common electrode 4 are formed on the substrate 1. Next, the gate insulating film 5 formed from the first insulating film is formed to cover the first gate electrode 2, the second gate electrode 3, and the common electrode 4. In the modification 1, the gate insulating film 5 is formed by successively depositing a silicon nitride film and a silicon oxide film by using the CVD method. More specifically, a silicon nitride film having a thickness of 400 nm is formed by using silane ($SiH_4$) gas, ammonia ($NH_3$) gas, and nitrogen ($N_2$) gas, and then, the gases are exhausted, and then, a silicon oxide film having a thickness of 50 nm is formed by using silane gas and nitrous oxide ($N_2O$) gas, Next, as in the preferred embodiment described above, the first oxide semiconductor layer 6, the second oxide semiconductor layer 7, and the third oxide semiconductor layer 11 are formed, as illustrated in. FIG. 5. Then, the entire substrate is annealed in an air atmosphere at 350° C. and for 60 minutes such that carrier concentration of the first oxide semiconductor layer 6, the second oxide semiconductor layer 7, and the third oxide semiconductor layer 11 becomes $1E+12/cm^3$ or less. Then, as in the preferred embodiment described above, the first source electrode 8 and the first drain electrode 9 are formed, as illustrated in FIG. 5.

Next, the surface of the gate insulating film 5 is removed by 50 nm or more by dry etching, with the first oxide semiconductor layer 6, the second oxide semiconductor layer 7, the first source electrode 8, and the first drain electrode 9 as the mask. In the modification 1, dry etching is performed by using a gas containing sulfur hexafluoride ($SF_6$) gas containing fluorine and hydrogen chloride (HCl) gas.

Next, an amorphous silicon film having a thickness of 100 nm is deposited by using the CVD method to cover the gate insulating film 5, the first oxide semiconductor layer 6, the second oxide semiconductor layer 7, the first source electrode 8, the first drain electrode 9, and the second conductive film. In the modification 1, silane ($SiH_4$) and hydrogen ($H_2$) are used as material gases for amorphous silicon.

Then, a photoresist pattern is formed in a photomechanical step, and patterning of the amorphous silicon film is performed by etching, with the photoresist pattern as the mask. In the modification 1, dry etching is performed by using a gas containing sulfur hexafluoride ($SF_6$) gas containing fluorine and hydrogen chloride (HCl) gas. Then, the photoresist pattern is removed, and the amorphous silicon layer 10 as illustrated in FIG. 10 is thereby formed on the gate insulating film 5, the first oxide semiconductor layer 6, the second oxide semiconductor layer 7, a part of the first source electrode 8, and a part of the first drain electrode 9. The subsequent manufacturing method is the same as that of the preferred embodiment described above, and a description thereof is omitted.

By the manufacturing steps described above, the gate insulating film 5 in the channel region of the pixel TFT 30 is made a silicon nitride film, and the gate insulating film 5 in the channel region of the drive TFT 40 is made a layer stack of a silicon oxide film and a silicon nitride film. Accordingly, the gate insulating film 5 in contact with the amorphous silicon layer 10 is made a silicon nitride film, and the gate insulating film 5 in contact with the third oxide semiconductor layer 11 is made a silicon oxide film.

<Modification 2>
<Configuration>

A modification 2 is characteristic in that phosphorus (P) is present at an interface of the first oxide semiconductor layer 6, the second oxide semiconductor layer 7, the first source electrode 8, and the first drain electrode 9 to the amorphous silicon layer 10.

As described above, a Schottky barrier is present between amorphous silicon and metal, and a depletion layer is present. Generally, an n-type dopant is implanted into amorphous silicon at a high concentration to degenerate the surface, that is, the interface, of amorphous silicon to reduce the width of the depletion layer, and tunneling current that tunnels the Schottky barrier is generated. Ohmic contact is enabled by the tunneling current.

In the modification 2, tunneling current can be generated due to the presence of phosphorus at an interference of the first oxide semiconductor layer 6, the second oxide semiconductor layer 7, the first source electrode 8, and the first drain electrode 9 to the amorphous silicon layer 10, and contact resistance between the amorphous silicon layer 10 and the first oxide semiconductor layer 6 and the second oxide semiconductor layer 7 can be further reduced. Moreover, ohmic contact is enabled between the amorphous silicon layer 10 and the first source electrode 8 and the first drain electrode 9. As a result, the on current of the pixel TFT 30 is increased, and power consumption can be reduced.

<Manufacturing Method>

A manufacturing method of the pixel TFT 30 and the drive TFT 40 configuring the TFT substrate 100 according to the modification 2 will be described below. In the following, differences to the modification 1 will be mainly described. FIG. 11 is a view illustrating a final mode of the modification 2.

First, the first gate electrode 2, the second gate electrode 3, and the common electrode 4 are formed on the substrate 1. Next, the gate insulating film 5 formed from the first insulating film is formed to cover the first gate electrode 2, the second gate electrode 3, and the common electrode 4. In the modification 2, the gate insulating film 5 is formed by successively depositing a silicon nitride film and a silicon oxide film by using the CVD method. More specifically, a silicon nitride film having a thickness of 400 nm is formed by using silane ($SiH_4$) gas, ammonia ($NH_3$) gas, and nitrogen ($N_2$) gas, and then, the gases are exhausted, and then, a silicon oxide film having a thickness of 50 nm is formed by using silane gas and nitrous oxide ($N_2O$) gas.

Next, as in the preferred embodiment described above, the first oxide semiconductor layer 6, the second oxide semiconductor layer 7, and the third oxide semiconductor layer 11 are formed, as illustrated in FIG. 5. Then, the entire substrate is annealed in an air atmosphere at 350° C. and for 60 minutes such that carrier concentration of the first oxide semiconductor layer 6, the second oxide semiconductor layer 7, and the third oxide semiconductor layer 11 becomes $1E+12/cm^3$ or less. Then, as in the preferred embodiment described above, the first source electrode 8 and the first drain electrode 9 are formed, as illustrated in FIG. 5.

Next, a plasma treatment is performed for several minutes using phosphine ($PH_3$). By performing the plasma treatment, phosphorus (P) is incorporated into the substrate surface, and a phosphorus containing layer 22 is formed. In the modification 2, a case is described where only phosphine ($PH_3$) is used in the plasma treatment, but gas obtained mixed with argon (Ar), helium (He) or other noble gases may alternatively be used to stabilize plasma discharge.

Next, the surface of the gate insulating film 5 is removed by 50 nm or more by dry etching, with the first oxide semiconductor layer 6, the second oxide semiconductor layer 7, the first source electrode 8, and the first drain electrode 9 as the mask. As a result, an unnecessary phosphorus containing layer 22 formed on the gate insulating film 5 is removed, and the gate insulating film 5 in the channel region of the pixel TFT 30 is made a single layer of a silicon nitride film.

Next, an amorphous silicon film having a thickness of 100 nm is deposited by using the CVD method to cover the gate insulating film 5, the first oxide semiconductor layer 6, the second oxide semiconductor layer 7, the first source electrode 8, the first drain electrode 9, and the second conductive film, in the modification 2, silane ($SiH_4$) and hydrogen ($H_2$) are used as material gases for amorphous silicon.

Then, a photoresist pattern is formed in a photomechanical step, and patterning of the amorphous silicon film is performed by etching, with the photoresist pattern as the mask. Then, the photoresist pattern is removed, and the amorphous silicon layer 10 as illustrated in FIG. 11 is thereby formed on the gate insulating film 5, the first oxide semiconductor layer 6, the second oxide semiconductor layer 7, a part of the first source electrode 8, and a part of the first drain electrode 9. The subsequent manufacturing method is the same as that of the preferred embodiment described above, and a description thereof is omitted.

In the modification 2, phosphorus present in the surfaces of the first oxide semiconductor layer 6, the second oxide semiconductor layer 7, the first source electrode 8, and the first drain electrode 9 is incorporated into the amorphous silicon layer 10 at the deposition temperature at the time of the amorphous silicon layer 10 being formed or by heating in the manufacturing process. As a result, the amorphous silicon layer 10 at the interface of the amorphous silicon layer 10 to the first oxide semiconductor layer 6, the second oxide semiconductor layer 7, the first source electrode 8, and the first drain electrode 9 is made an n-type layer, and desirable ohmic contact is enabled, and also, contact resistance can be reduced.

While the invention has been shown and described in detail, the foregoing description is in all aspects illustrative and not restrictive. It is therefore understood that numerous modifications and variations can be devised without departing from the scope of the invention.

What is claimed is:

1. An array substrate comprising a first thin film transistor and a second thin film transistor on a substrate, wherein
    the first thin film transistor includes
        a first gate electrode provided on the substrate,
        a gate insulating film provided covering the first gate electrode,
        a first oxide semiconductor layer and a second oxide semiconductor layer provided on the gate insulating film while overlapping the first gate electrode in plan view, with a first separation portion separating the first oxide semiconductor layer and the second oxide semiconductor layer from each other,
        a first source electrode and a first drain electrode provided extending from above the first oxide semiconductor layer and above the second oxide semiconductor layer, respectively, onto the gate insulating film while overlapping the first oxide semiconductor layer or the second oxide semiconductor layer in plan view, with a second separation portion, greater than the first separation portion, separating the first source electrode and the first drain electrode from each other, and
        an amorphous silicon layer provided extending on the first separation portion on the gate insulating film, the second separation portion, a part of the first source electrode, and a part of the first drain electrode, and
    the second thin film transistor includes
        a second gate electrode provided on the substrate,
        the gate insulating film provided covering the second gate electrode,
        a third oxide semiconductor layer provided on the gate insulating film while overlapping the second gate electrode in plan view, and
        a second source electrode and a second drain electrode provided extending from above the third oxide semiconductor layer onto the gate insulating film while overlapping the third oxide semiconductor layer in plan view, with a third separation portion separating the second source electrode and the second drain electrode from each other.

2. The array substrate according to claim 1, wherein
    the first thin film transistor further includes a third source electrode and a third drain electrode provided extending from above the amorphous silicon layer onto the first source electrode and the first drain electrode, respectively, while being separated from each other on the amorphous silicon layer, and
    the second thin film transistor further includes
        a fourth source electrode provided on the second source electrode, and
        a fourth drain electrode provided on the second drain electrode.

3. The array substrate according to claim 2, wherein
    the first thin film transistor further includes a protective insulating film provided covering the amorphous silicon layer, the third source electrode, and the third drain electrode, and
    the second thin film transistor further includes the protective insulating film provided covering the third oxide semiconductor layer, the fourth source electrode, and the fourth drain electrode.

4. The array substrate according to claim 2, wherein
    the third drain electrode is provided extending from above the first drain electrode onto the gate insulating film, and
    the third drain electrode provided on the gate insulating film is a pixel electrode.

5. The array substrate according to claim 2, wherein
    the first gate electrode and the second gate electrode are formed of a same layer,
    the first oxide semiconductor layer, the second oxide semiconductor layer, and the third oxide semiconductor layer are formed of a same layer,
    the first source electrode, the first drain electrode, the second source electrode, and the second drain electrode are formed of a same layer, and
    the third source electrode, the third drain electrode, the fourth source electrode, and the fourth drain electrode are formed of a same layer.

6. The array substrate according to claim 2, wherein
    the first gate electrode and the second gate electrode are of a material having a same composition,
    the first oxide semiconductor layer, the second oxide semiconductor layer, and the third oxide semiconductor layer are of an oxide semiconductor material having a same composition, and
    the third source electrode, the third drain electrode, the fourth source electrode, and the fourth drain electrode are of a material having a same composition.

7. The array substrate according to claim 1, wherein
    the gate insulating film in contact with the amorphous silicon layer is a silicon nitride film, and
    the gate insulating film in contact with the third oxide semiconductor layer is a layer stack of a silicon nitride film and a silicon oxide film.

8. The array substrate according to claim 1, wherein phosphorus is present at an interface of the first oxide semiconductor layer, the second oxide semiconductor layer, the first source electrode, and the first drain electrode to the amorphous silicon layer.

9. The array substrate according to claim 1, wherein
the first thin film transistor is a transistor for pixel display, and
the second thin film transistor is a transistor for a drive circuit.

10. A liquid crystal display comprising the array substrate according to claim 4, wherein
the array substrate further includes a slit-shaped counter electrode provided on the gate insulating film while overlapping the pixel electrode in plan view.

11. A thin film transistor comprising:
a substrate;
a gate electrode provided on the substrate;
a gate insulating film provided covering the gate electrode;
a first oxide semiconductor layer and a second oxide semiconductor layer provided on the gate insulating film while overlapping the gate electrode in plan view, with a first separation portion separating the first oxide semiconductor layer and the second oxide semiconductor layer from each other;
a source electrode and a drain electrode provided extending from above the first oxide semiconductor layer and above the second oxide semiconductor layer, respectively, onto the gate insulating film while overlapping the first oxide semiconductor layer or the second oxide semiconductor layer in plan view, with a second separation portion, greater than the first separation portion, separating the source electrode and the drain electrode from each other; and
an amorphous silicon layer provided extending on the first separation portion on the gate insulating film, the second separation portion, a part of the source electrode, and a part of the drain electrode.

* * * * *